US007769236B2

(12) United States Patent
Fiala

(10) Patent No.: US 7,769,236 B2
(45) Date of Patent: Aug. 3, 2010

(54) MARKER AND METHOD FOR DETECTING SAID MARKER

(75) Inventor: Mark Fiala, Fredericton (CA)

(73) Assignee: National Research Council of Canada, Ottawa, ON (CA)

( * ) Notice: Subject to any disclaimer, the term of this patent is extended or adjusted under 35 U.S.C. 154(b) by 915 days.

(21) Appl. No.: 11/589,726

(22) Filed: Oct. 31, 2006

(65) Prior Publication Data

US 2007/0098234 A1 May 3, 2007

Related U.S. Application Data

(60) Provisional application No. 60/731,478, filed on Oct. 31, 2005.

(51) Int. Cl.
G06K 9/62 (2006.01)
G06K 9/48 (2006.01)

(52) U.S. Cl. ........................................ 382/225; 382/199

(58) Field of Classification Search ................. 382/103, 382/181, 182, 184, 190, 199, 201, 225
See application file for complete search history.

(56) References Cited

U.S. PATENT DOCUMENTS

| 5,554,841 | A | 9/1996 | Kost et al. | |
|---|---|---|---|---|
| 6,650,776 | B2 | 11/2003 | Ihara et al. | |
| 7,343,278 | B2 * | 3/2008 | Billinghurst et al. | .......... 703/23 |
| 2004/0071315 | A1 | 4/2004 | Neely | |
| 2006/0023933 | A1 * | 2/2006 | Mitsui | ........................ 382/145 |
| 2007/0133841 | A1 * | 6/2007 | Zhang et al. | ................. 382/103 |

OTHER PUBLICATIONS

Kawano, T. et al., "A Coded Visual Marker for Video Tracking System Based on Structured Image Analysis"; *Proceedings of the Second IEEE and ACM International Symposium on Mixed and Augmented Reality* (ISMAR 2003).
Zhong, X. et al., "Designing a Vision-based Collaborative Augmented Reality Application for Industrial Training"; *Information Technology*, 45: 7-19, 2003.

(Continued)

*Primary Examiner*—Daniel G Mariam
(74) *Attorney, Agent, or Firm*—Christine Piché

(57) ABSTRACT

This invention discloses marker detectable by visual means comprising; a polygonal border having of at least four non collinear salient points. The marker has on it a pattern in binary digital code. The binary code data contains information data, checksum and error correction. The binary code data is on two levels; a first level of binary code readable at a first given distance, a second level of binary code readable at a second given distance, where the second given distance is less than the first given distance and the second level binary code is smaller in size than the first level binary code. The second level of binary code does not interfere with the reading of the first level binary code. It also discloses a method for detecting a marker comprising the steps of detecting an image, using an edge detector to detect an edge in said image, grouping more than one edge into a polygon having salient points, calculating homography from polygon salient points, generating a list of homographies, extracting binary data from input image having homographies, identifying and verifying binary data.

18 Claims, 9 Drawing Sheets detection of unique features (polygon borders) using edge-based method

OTHER PUBLICATIONS http://metlab.cse.msu.edu/tracking-prepared/tracking-prepared.htm; "Tracking in prepared spaces"; Nov. 29, 2004.
http://www.tlashford.com/frames/sym_maxicode/sym_maxicode.htm; "Product Information—Maxicode"; Nov. 29, 2004.
http://www.highenergymagic.com/spotcode/symbols.htm; "High energy magic"; Nov. 29, 2004.
http://www.soft.uni-linz.ac.at/_wiki/tiki-index.php?page=VisualCodeNamingService; "A Naming Service for the Visual Codes Visual Marker System"; Nov. 29, 2004.
http://www.phasespace.com/faq.html; "PhaseSpace—Optical Motion Capture Systems"; Nov. 29, 2004.

* cited by examiner

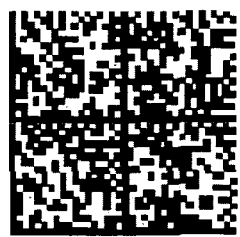  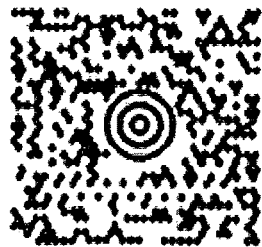 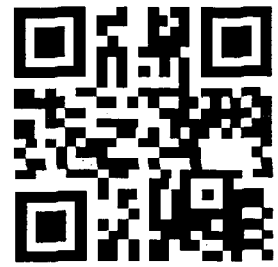
Data Matrix
*(3 examples)*
Maxicode
*(US Postal Service)*
QR
*(Quick Response Code)*
1a
1b
1c
Figure 1. Three 2d fiducial markers

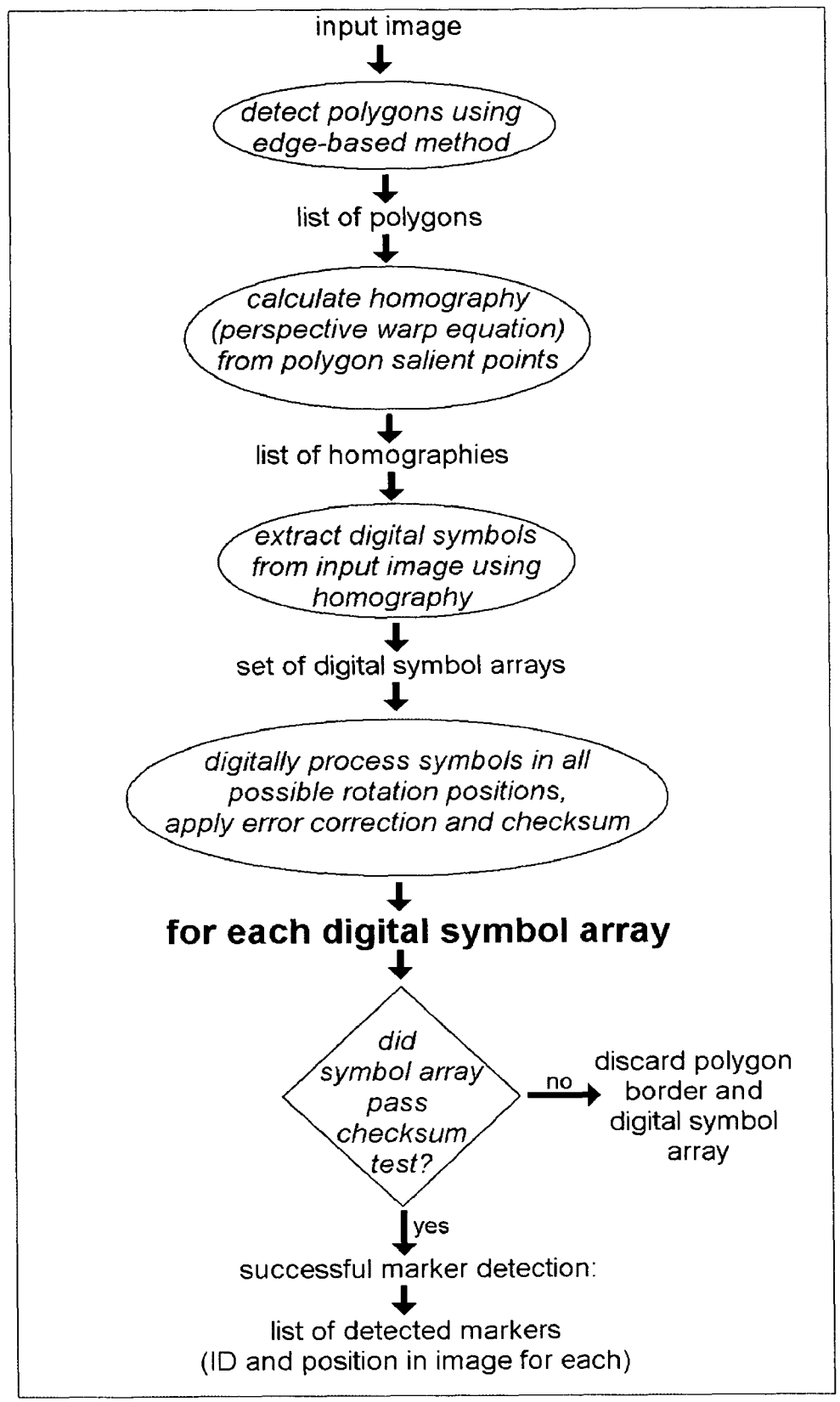
Figure 2: Flow chart of marker detection method

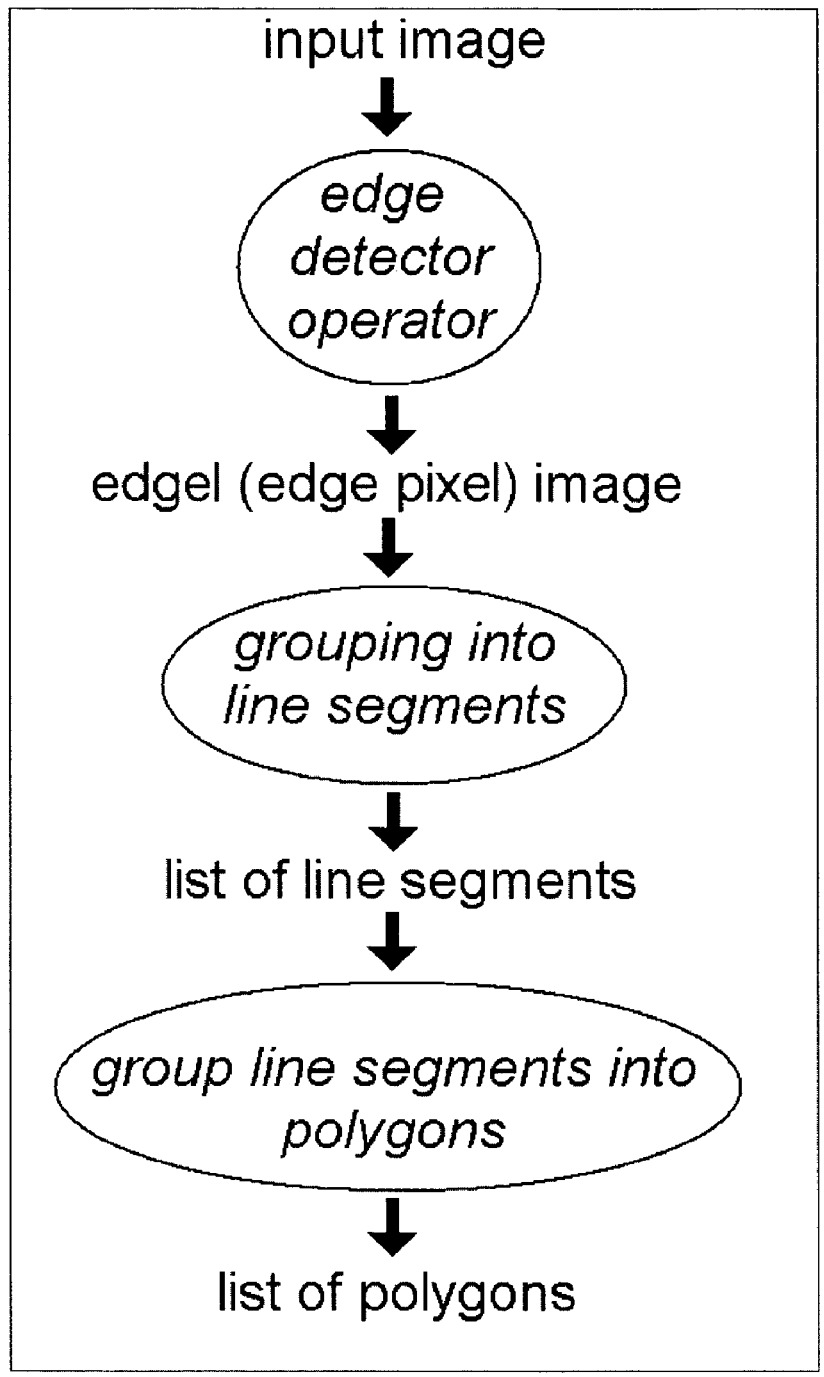
Figure 3: detection of unique features (polygon borders) using edge-based method

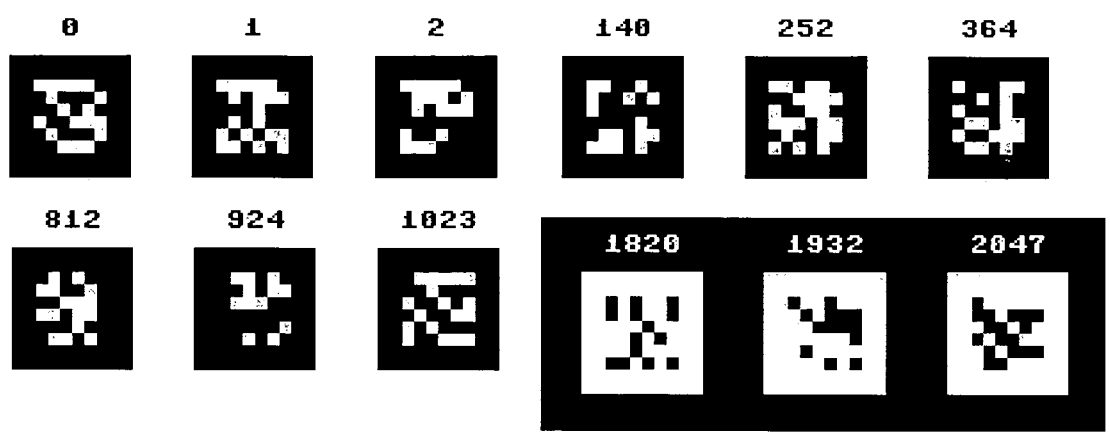
Figure 4. 12 example markers in the ARTag system.

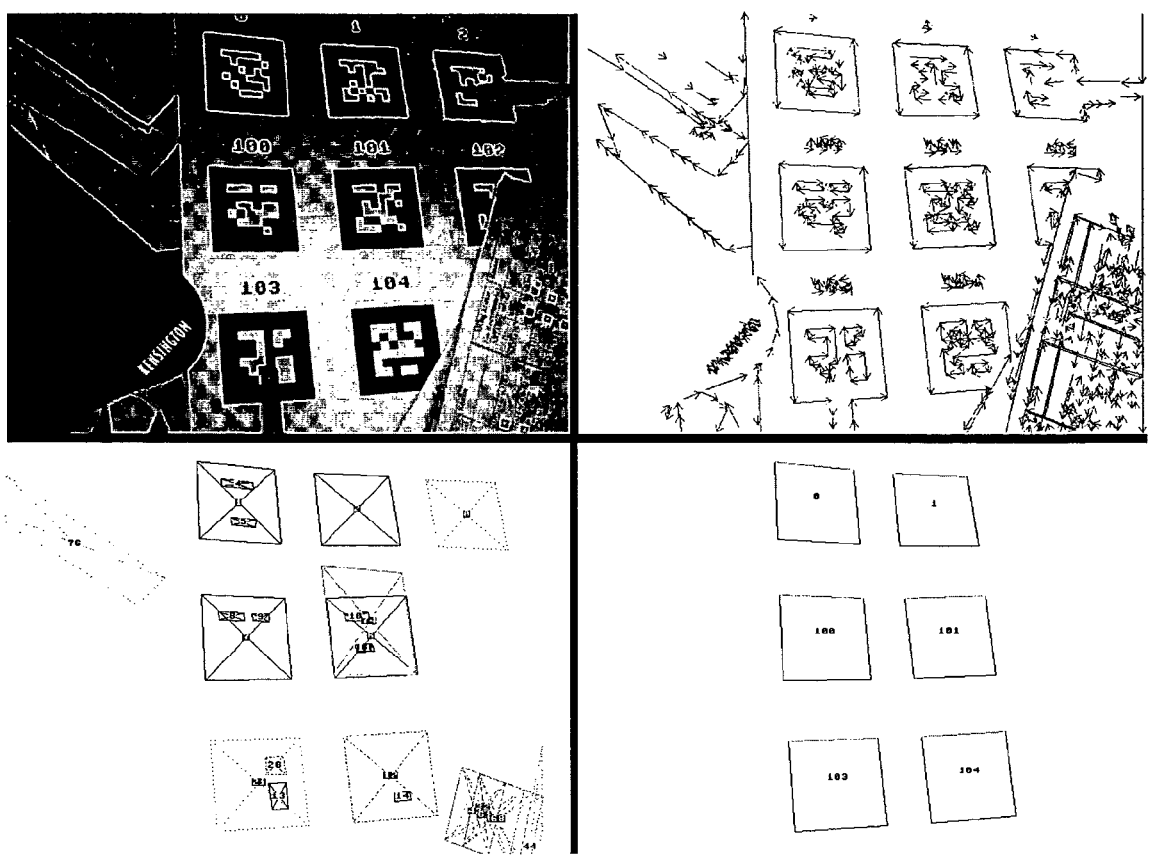
Figure 5. Stages of marker detection:

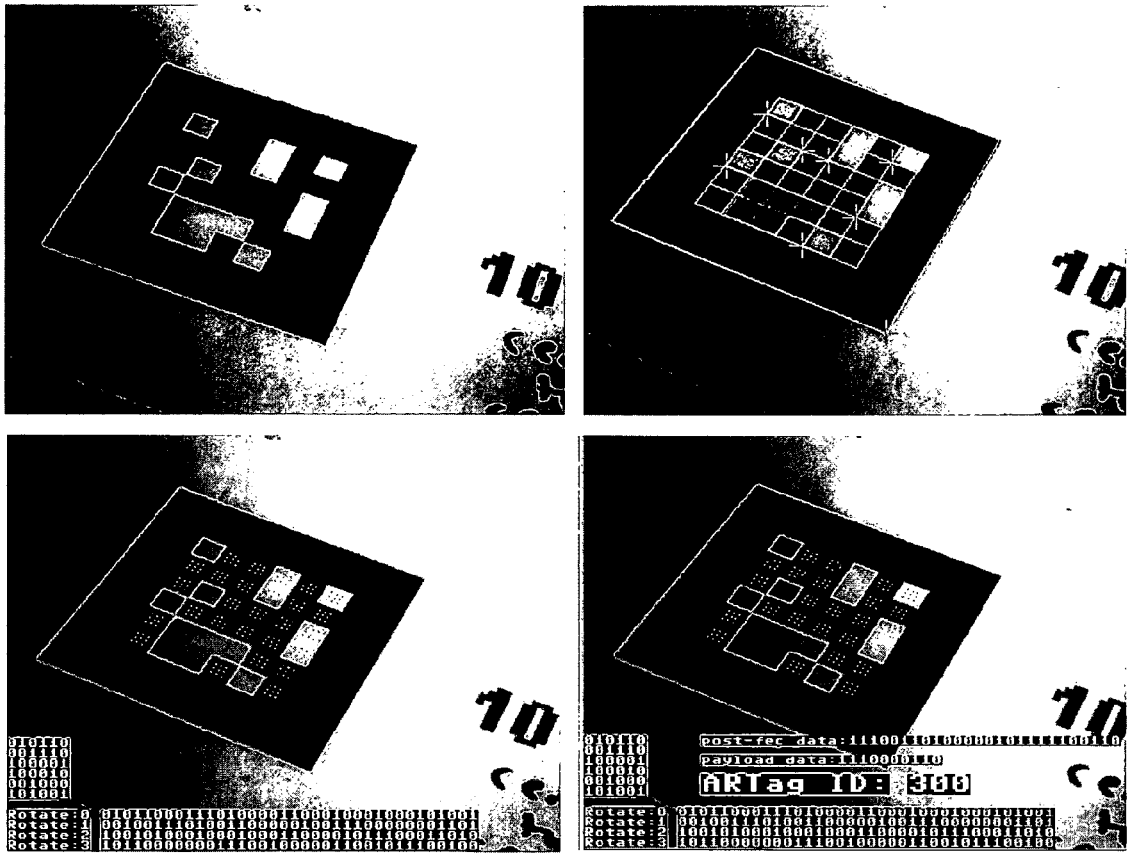
Figure 6. Stages of verification and identification using digital pattern
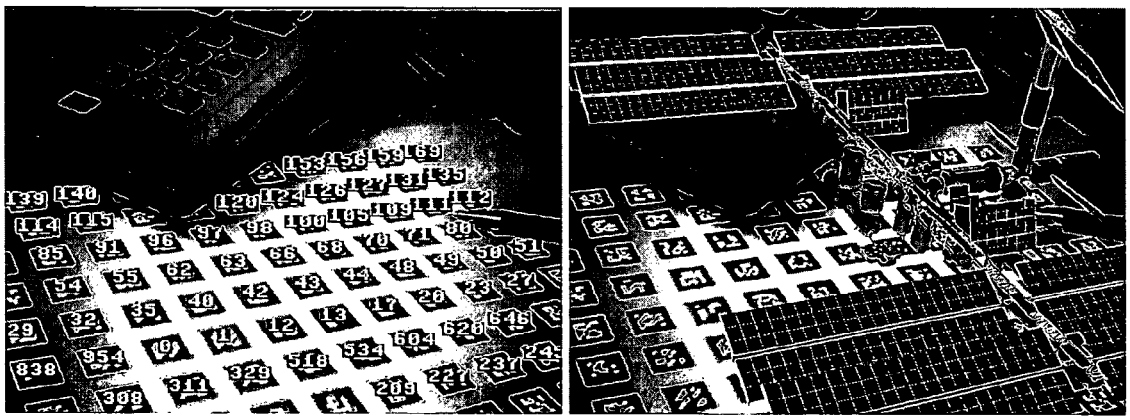
Figure 7. Application of fiducials for augmented reality,

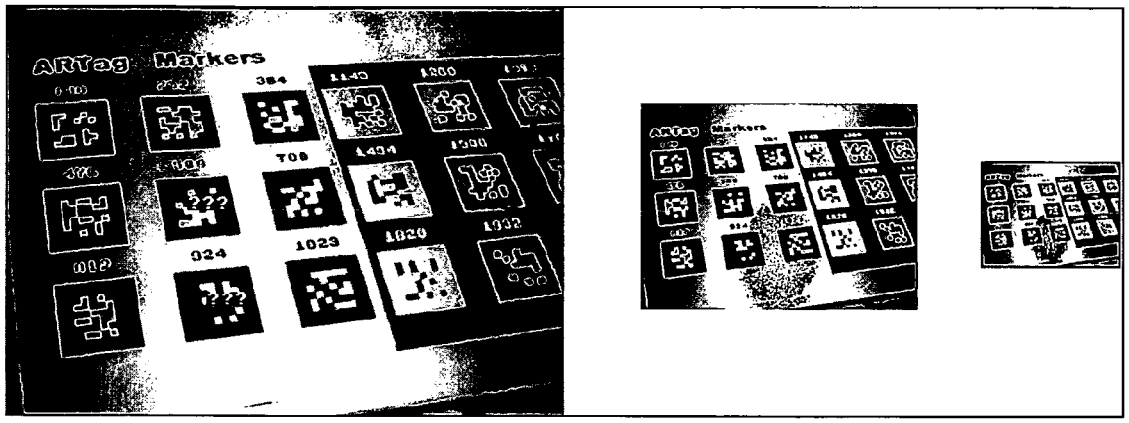
Figure 8. Input image is processed at three resolution levels
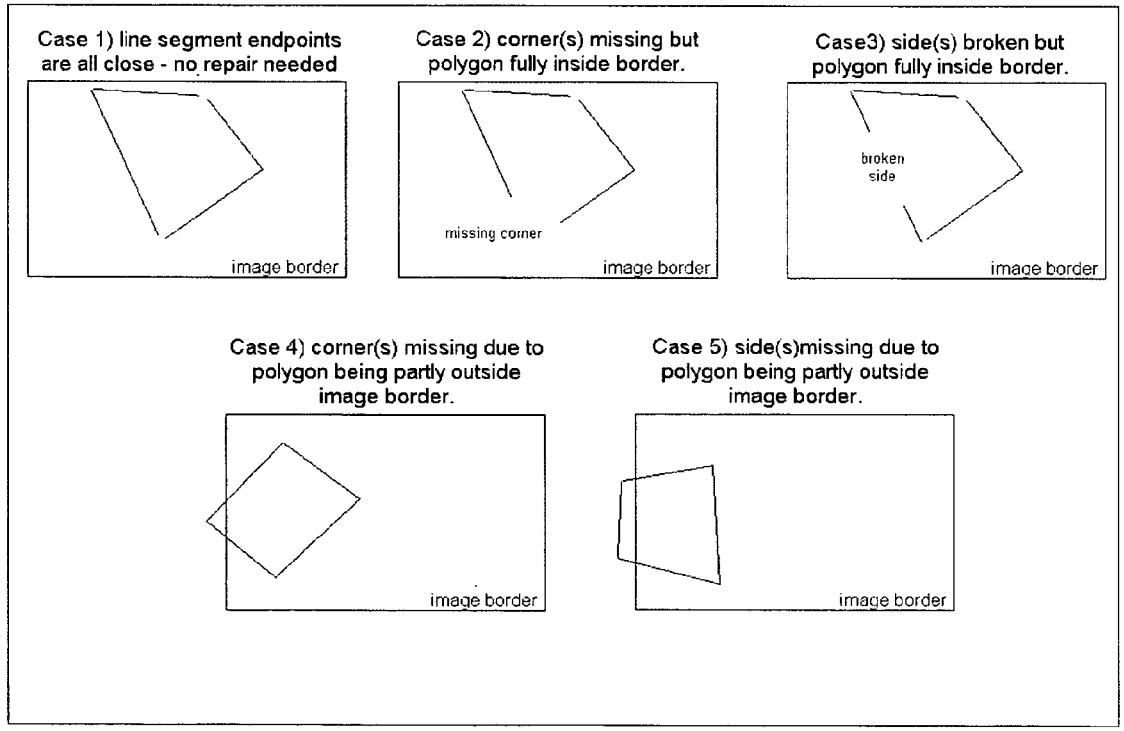
Figure 9. Five cases of detecting polygon borders

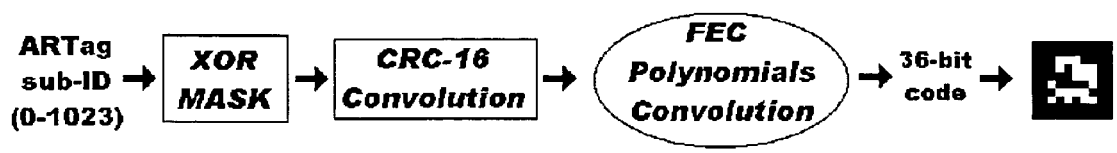
Figure 10. Creation of digital pattern inside ARTag markers
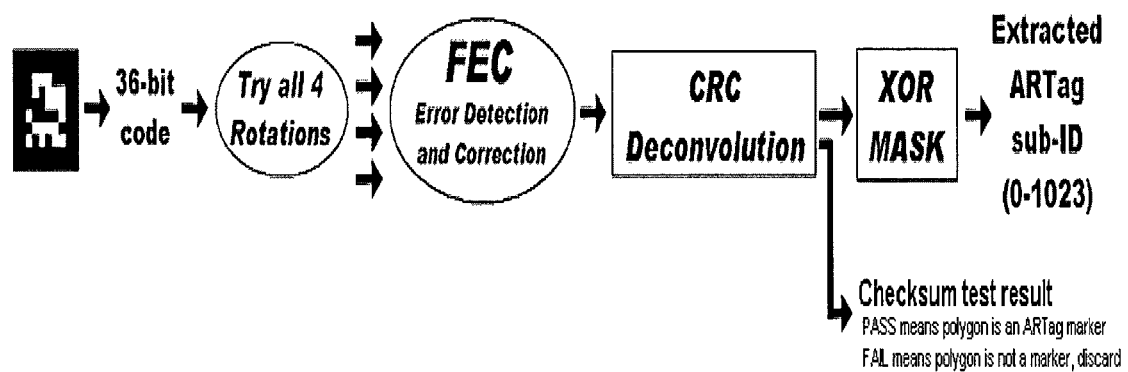
Figure 11. decoding of digital pattern

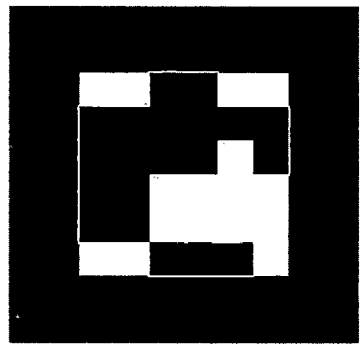
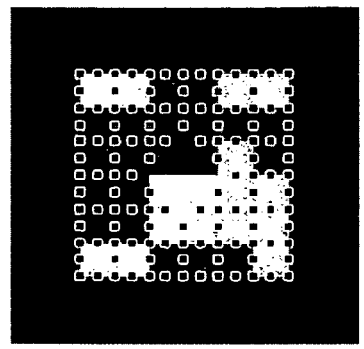
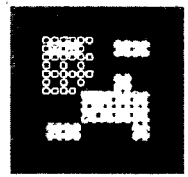
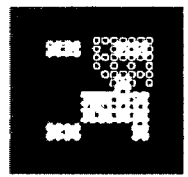
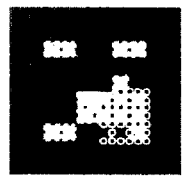
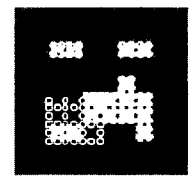
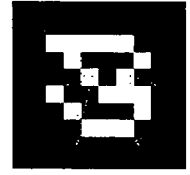
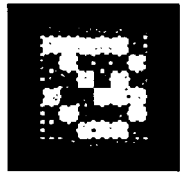
Figure 12: two level marker

MARKER AND METHOD FOR DETECTING SAID MARKER

This application is a cross-reference of corresponding U.S. Provisional Patent Application 60/731,478 filed Oct. 31, 2005.

Field of the Invention

This invention relates to visual markers and methods of detecting visual markers. More specifically, this invention relates to markers used in Augmented reality and 3D position sensors.

BACKGROUND OF THE INVENTION

Marker patterns can be added to objects or scenes to allow automatic systems to find correspondence between points in the world and points in camera images, and to find correspondences between points in one camera image and points in another camera image. The former has application in positioning, robotics, and augmented reality applications, the latter has application in automatic computer modeling to provide the coordinates of world points for applications of the former. Furthermore, marker patterns can be used to contain information relating to various products. For example, marker patterns printed out and mounted on a piece of equipment would allow an augmented reality system to aid a person constructing or servicing this equipment by overlaying virtual graphics with instructions over their view, with the aid of an image sensor (light capturing device such as camera, video camera, digital camera, etc) and the computer vision techniques that locate these patterns. Furthermore with camera cell phones and PDAs becoming commonly available, a marker could be used to link a user to a URL address providing access to a series of images, adverstisement ect. An other example of use includes, a robot could which navigates by detecting markers placed in its environment. Using computer vision, cameras and cameras cell phones to determine relative pose is an inexpensive and accurate approach useful to many domains.

There are several systems that use a light capturing device (film camera, video camera, digital camera, camera cell phones etc) and markers to provide these correspondences; they can be classified into active and passive systems. Active marker systems are defined by if the marker emits radiation (radio, visible light, infrared light, etc) to aid in its detection, while passive markers do not require power and only reflect or in some way modify incoming electromagnetic radiation. An analogy using human vision is traffic signals, traffic lights are active markers, and stop signs are passive markers. Passive markers are beneficial for many applications as they are typically much less complex and expensive, and require little or no maintenance. Markers can be made with a standard printer or can be composed of special material to improve detection such as retro-reflective material or material with shading differences only visible in infrared. Often, a passive marker is just a special pattern printed out on paper. However, while passive systems can be simpler and less expensive in hardware requirements, they need more sophisticated systems such as computer vision to detect and identify the markers.

Examples of passive markers include systems using a rigid constellation of small spheres. Others use flat patterns visible to the human eye with bi-tonal (black and white), varying shades of grey, and color patterns. These are not always very effective because of their reliance on the lighting conditions and specific light gathering device used, for example systems relying on recognizing color in markers typically need more expensive video cameras, need to control the lighting so the spectral content and brightness does not vary, and often need to not change the cameras or their positions. Likewise other systems that rely on the shades of grey in the marker could require the entire setup of lighting, markers, and cameras need to be carefully controlled similar to a studio setting, require much adjustment to function, and typically cease to function when the conditions change.

A useful fiducial marker system should function under any reasonable conditions of varying lighting, using almost any available image sensor to make it a useful product.

Existing fiducial marker systems such as ARToolkit, ARToolkit Plus, Matrix, Binary Square Marker, cybercode suffer from this susceptibility to lighting. This susceptibility is due to the binary thresholding algorithm used by these and other marker systems, the weakness lies in their common approach of attempting to label all image pixels as belonging to one or another set, these systems attempt to classify parts of the image by some method to attempt to recognize different levels of reflectance from the marker and its surroundings.

Typically these marker systems attempt to divide the image into light and dark regions, they have an intermediate stage called a binary image of same dimensions as the input image where every pixel is either labeled as white or black. Following this morphology operations are applied to group the pixels into connected regions, each white or black pixel is then labeled by an object number it belongs to.

Reactivision is a system that uses the topology information of connected regions of light and dark inside one another to recognize a marker, most other systems use the contours of these connected regions to find some unique feature such as a polygon border. This step of attempting to separate different levels of reflectance of objects and markers in the image sensor by labeling the received intensity levels at image pixels is a weak point, often they attempt to simply classify white pixels from black by applying a threshold to the image or a region. This often fails because it is often not possible to separate objects or marker sections by applying a brightness or color threshold. These systems do not function well because of the assumption that parts of markers with equal reflectance properties (shading or coloring) will manifest themselves as regions of uniform incoming light to an image sensor.

Most passive marker systems rely on a two step process; firstly locating a unique feature such as a geometric feature, and secondly by verification and identification step to determine if it is indeed a marker and which one it is out of a library of possible markers. Often marker systems fail in the first step due to their reliance on the binarization method described above.

Another source of weakness for existing marker systems is their lack of robust processing in the verification and identification stages. Most other marker systems use digital patterns encoded in the marker and do the verification and identification by processing an extracted set of digital symbols. Often the digital symbols found in the image are simply compared to a set of expected symbol sets to verify if it is a marker. A superior method is to use a checksum, to allocate some of the digital symbols that can be decoded to verify data integrity, such as the CRC-16 16-bit checksum or a simply parity check with one checksum symbol. Some use checksums such as Matrix and Binary Square Marker which gives them more robust performance, but these systems still fall short of practical usability because of their use of the binarization method, and because of an insufficient amount of information in the marker. Binary Square marker only uses a grid of 12 information carrying cells in the marker which cannot convey much information to allow reliable detection.

The act of extracting a set of digital symbols from the image sensor's array of pixels can sometimes introduce errors due to sources such as image sensor noise, lighting variances, or partial occlusion (blocking) of objects. Error detection and correction algorithms, can recognize and repair some errors at the cost of requiring more digital symbols. Current marker systems do not use both error correction and checksums which greatly reduces their effectiveness.

Also of consideration for a fiducial marker system is the ability to function with the geometric distortion of a perspective projection image sensor, which represents the most common type of film, digital, and video cameras available. The application of the mathematical method of homographies allows this distortion to be accounted for by using the position of at least four non-collinear points in the image if both the marker pattern and the image sensor are flat planes and the image capture can be modeled with the pinhole model. 2D barcode systems such as Datamatrix, QR, Maxicode and Cybercode (FIG. 1) are not suitable as fiducial markers because they provide less than four such salient points. They are intended for situations with a narrow field of view or placement parallel to the image plane such that their projection in the image can be approximated by an affine projection only requiring three such points. Datamatrix illustrated in FIG. 1a has the L-shaped located for which the two ends and the corner are 3 points used to define an "affine" transform to decode the digital pattern, likewise QR illustrated in FIG. 1b has 3 square blocks in the corner for the same purpose.

Finally, existing systems that use digital patterns do not provide proper level of information encoded in the marker. They either provide too little as with Binary Square Marker, Matrix, SCR, HOM, IGD, Canon, or provide too much such as the 2D barcode systems like Cybercode. There has to be enough information to encode enough uniqueness to have a sufficiently large library of potential markers and to have symbols allocated for a checksum and for error correction. Also the information encoded has to be small enough that the marker can be detected with a minimum small number of image pixels. The latter requirement affects the range of distance a given marker can be detected at. One purpose of a fiducial marker system is to find correspondences, another purpose would be to carry information. They are designed to be detectable with their size in the image being as small as possible to give the greatest range the marker system can be used at. Thus, the marker should be as small as possible to give the greatest detection range but be large enough to contain enough information to allow it to be reliably detected.

The issues discussed above are now defined more precisely as parameters necessary for a reliable and useful markers systems. Some numerical metrics for appraising marker systems are;
1) the false positive rate,
2) the inter-marker confusion rate,
3) the false negative rate,
4) the minimal marker size,
5) the vertex jitter characteristics,
6) the marker library size, and
7) the speed performance.

The false positive rate is the rate of falsely reporting the presence of a marker when none is present. The inter-marker confusion rate is the rate of when a marker is detected, but the wrong id was given, i.e. one marker was mistaken for another. The false negative rate is the probability that a marker is present in an image but not reported.

Another metric is 4) the minimal marker size which is the size in pixels required for reliable detection as discussed above. Speed performance is a consideration, a vision based fiducial marker tracking system must be real time with available computing power and thus the detecting computer vision algorithm must be efficient enough to use existing technology. Two other factors of fiducial marker system performance, not quantitatively measured herein but described loosely, are the immunity to lighting conditions and occlusion. Occlusion is when a fiducial marker is partially or completely blocked from view by the camera by some other object, a marker system should be able to still detect a marker despite partial occlusion. A robust marker system for industry should be able to detect markers with widely varying lighting.

The existing systems only typically exist in laboratories due to their weakness in some or all of the above categories, their lack of robustness discounts them from wide implementation in industry and society.

SUMMARY OF THE INVENTION

It is an object of the invention to provide a more robust method for detecting visual markers.

It is an object of the invention to provide a marker which is reliably detected.

These and other objects of the invention are accomplished by having a marker detectable by visual means comprising; a polygonal border having of at least four non collinear salient points. The marker has on it a pattern in binary digital code. The binary code data contains information data, checksum and error correction. The binary code data is on two levels; a first level of binary code readable at a first given distance, a second level of binary code readable at a second given distance, where the second given distance is less than the first given distance and the second level binary code is smaller in size than the first level binary code. The second level of binary code does not interfere with the reading of the first level binary code.

And by having a method for detecting a marker comprising the steps of detecting an image, using an edge detector to detect an edge in said image, grouping more than one edge into a polygon having salient points, calculating homography from polygon salient points, generating a list of homographies, extracting binary data from input image having homographies, identifying and verifying binary data.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which:

FIG. 1 illustrates commercially available 2D barcodes (prior art).

FIG. 2 illustrates one embodiment of the marker detection method.

FIG. 3 illustrates one embodiment of the edge based method.

FIG. 4 illustrates 12 example markers

FIG. 5 illustrates stages of marker detection

FIG. 6 illustrates an embodiment of the verification and identification stages

FIG. 7 illustrates an embodiment of the invention used for augmented reality FIG. 8 illustrates an embodiment of the invention being processed FIG. 9 illustrates an embodiment of the invention to repair incomplete polygon borders FIG. 10 illustrates an embodiment of the invention for the creation of digital pattern inside a marker FIG. 11 illustrates an embodiment of the invention for decoding a digital pattern FIG. 12 illustrates an embodiment of a two level marker

DESCRIPTION OF PREFERRED EMBODIMENTS

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

This application describes a "fiducial marker system" using digital patterns designed to satisfy the requirements stated in the background section. It includes the simultaneous application of an edge-based method to find polygon borders and the use of single or multi level of data including both checksums and error correction in the digital pattern component of the marker. The edge-based approach for polygon border detection provides more robust detection of markers in situations of uncontrolled lighting and partial occlusion. The dual level marker allows for additional information to be stored, including links to internet sites, advertisement. Whereas the application of both digital checksums and error detection and correction algorithms provides lower false positive and false negative detection rates.

An embodiment of the invention operates as follows: 2D marker patterns containing a polygon border and a single or dual level of digital pattern are mounted or projected on objects; electromagnetic radiation reflecting from the objects is captured by one or more image detection means as a 2D image, with one or more spectral components. A computer vision method is used to detect the markers' in the image. This can be used for detecting the pose between the image sensors and the objects.

Flat marker patterns are composed of a polygon border and an area or areas with a single or dual level digital pattern carrying information that is decoded once the polygon border is detected. The image detection means acts both to validate the presence of a marker in the image, and to identify which one it is out of a possible set of markers. Robust digital methods of checksums and error correction, as well as an edge-based method of recognizing the polygon border from line segments found from edge pixels, allow the system to provide a dependable set of correspondences despite image noise and partial occlusion.

The markers are detected in a two step process; first detecting an image, locating a unique feature in the image, secondly verifying that this feature is a marker and identifying which one it is by examining the digital pattern. In our system the unique feature is a polygon border having at least non collinear four salient points.

The polygon border is found by an edge-based method with the following steps; 1) an edge operator is applied to the image to find edgels (edge pixels), 2) grouping of edgels into straight line segments, 3) grouping of straight line segments into closed or nearly closed polygons. The processing for this stage occurs by converting the image into a list of edgels, converting the list of edgels into a list of line segments, and finally by converting the list of line segments into a list of polygons.

The edge operator is an image processing operation which provides a probability of a pixel being from the edge of an object by examining the neighboring pixels, this stage takes the 2D image as an input and outputs a 2D image of "edgels". Many edge operators exist in the field of image processing and can be used such as the Sobel, Marr-Hildreth, and Canny edge detector.

The edgels are combined into straight line segments (edges), there are a number of ways to perform this stage, in an embodiment of the invention the method of fitting line equations to neighboring edgels is performed by the method of least squares. The embodiment also joined collinear and close line segments to allow small breaks to be repaired.

The line segments are combined into polygons by locating line segments with nearby endpoints where in our system the definition of nearby is the Euclidean distance. Each line segment can contribute to several polygons. When a closed set of line segments is found of the expected number of sides, it is forwarded to the next level.

FIG. 5 illustrates these stages of marker detection: the upper left corner illustrates the original camera image being detected. In the upper right corner we see the line segments which were found by grouping edgels (edge pixels). In the lower left corner there is a list of possible polygon borders located, and in the lower left corner illustrates the polygons whose digital patterns were successfully read which are read as markers.

Our system also uses heuristic rules to locate polygons which are partially broken inside the image or by the image border. FIG. 5 upper right corner and FIG. 9 illustrate the five main cases which the system addresses; case 1) when the border can be simply found by joining line segments, case 2) when the border is found when one or more corners are missing but the, polygon border lies entirely within the image, case 3) when a side is broken when the polygon border lies entirely within the image due to occlusion, case 4) when one or more corners are missing by being cut by the edge of the image (the marker is partly outside the field of view), and case 5) when one or more sides (one for our quadrilateral border) are missing by being cut by the edge of the image (the marker is partly outside the field of view).

FIG. 7 illustrates an application of a fiducial marker for augmented reality where the markers were are hidden by a telephone. As can be seen, where part of the marker is visible, it can be detected and is still identifiable. The image on the left of FIG. 7 illustrates a space station which appears to sit above the markers. Even as the angle of the camera changes, the satellite always appears to be above the surface.

The unique feature of the marker, which is detected first, is a polygon border in our system. Furthermore the polygon border should provide at least four non collinear salient points to allow the proper extraction of image points despite perspective distortion which is encountered in image sensors which capture incoming radiation by a perspective projection. In an embodiment of the invention a square is chosen for the polygon border the four corners are salient points for calculating the homography equations for calculating the position of the digital pattern of the marker. In this embodiment the computer vision system is searching for quadrilaterals in the image.

The polygon border could be a square, rectangle, pentagon, hexagon, etc with equal or unequal side lengths as long as it had at least four salient points.

In an embodiment of the invention examining the decoded digital symbols' checksum reduce the sensitivity of the system to any specific spot in the pattern. In this embodiment one or more than one levels of data are enclosed with the first level having the largest cells for detection at a first distance which is a further distance, the second level being detectable at a second distance which is less than the first distance providing more information. FIG. 12 illustrates such an embodiment. The first level could comprise information such as the identification of the tag. As a user bring the image reading means closer, additional information can be read from the second level. This second level of data could provide a user using a camera cell phone or a PDA a mapping to a web address from which the augmented model, image, or animation is loaded.

The embodiment is fully functional using only one level. Information codes, with a checksum, and error correcting codes together as a set of digital symbols can be encoded in the first level of data. The information codes can be identification information. The symbols for all levels of data are encoded together in the digital pattern part of the fiducial marker.

With a two level marker, the second level code is physically smaller than the first level, and as such is readable at a second distance which is less than the first distance. It is however imperative that the second level of data does not interfere with the reading of the first level of data.

The first level of data uses all three elements of marker ID, a checksum, and error correcting codes, subsequent levels of data can each contain any combination of these three elements. For each data level, these elements can be combined in any way, such as simply appending them one after another, or by scrambling the information throughout the symbol array.

In an embodiment of the invention the latter is done using simple binary multiplication when generating the markers, the opposite operation of division is used to separate them when detecting them.

FIG. 4 illustrates 12 example markers of one embodiment of the invention where 36 digital binary symbols are used for the first level with ten binary symbols dedicated to the information data (labeled sub-ID in figures) such as identification, sixteen binary symbols for the checksum and ten binary symbols for error correcting codes.

FIG. 12 illustrates another embodiment of the invention having a two level marker. The first level contains a large 6×6 array of cells inside the polygonal border. These 36 cells carry 10 bit of information, such as the marker's ID, and the other 26 bits are used for checksum and error correction. Only the center of the 36 cells is sampled and therefore typically leaving room along the borders between the cells for more information as long as it does not interfere with the reading of the first level cells. Typically as long as it does not encroach by more than 20% into the cell interior. An embodiment of the invention proposed a second level of 12×12 array of cells, i.e. 124 smaller cells are added along the borders. These carry the second level information data as well as checksum and error correction code. The second level information could provide a direct or an indirect link to a URL address or any other kind of information. The indirect link would encode a reference number which when decoded would refer to a link.

Because the second level is smaller in size, it is not likely that all the cells will be properly sampled. Therefore in one embodiment of the invention, there is two levels of redundancy is offered. The 124 cells are divided into four quadrants; each having 16 bits of information, 5 bits of checksum, and 5 bits of error correction for a total of 31 bits of codes per quadrant. The 124 cells are used to carry 32 (16×2) bits of information; therefore, two of the four quadrants provide redundant information of the other two quadrants. FIG. 12 illustrates these four quadrants, where the same codes are place in the first and the third quadrant and in the 1 and $2^{nd}$ quadrant. As such only two neighboring quadrants need to be decoded correctly for the $2^{nd}$ level information to be extracted. Each quadrant also can survive several bits being read erroneously due to the error correction algorithms. Thus in this embodiment of the invention these is two levels of redundancy, the error correcting codes and the repetition of the entire data quadrant.

Another embodiment of the invention proposes to integrate the second level of data inside the cells such that that the resultant color of the cell does not interfere with the first level data. For example if the $1^{st}$ level cell should be white; the majority of $2^{nd}$ level cells should white such that the average value of the $1^{st}$ level cell is distinguishable to be white. The number and position of the white and nonwhite level 2 cells would then encode the information.

The digital pattern of the marker is an array, or arrays of sections of the marker called cells. Each cell has one of several possible reflectance profiles, which could include different spectral response (such as different colors in the visible spectrum), polarization, or reflectivity levels. In an embodiment of the invention it was chosen to process a single spectral band without polarization, and with only two different levels of reflectivity, this allowed common printers, photocopiers, or projectors to be used to create or project the markers and low cost image visible or infrared light sensors for the capture of electromagnetic radiation. This gives the system flexibility and low cost and complexity of usage. The array of digital symbols could be encoded with one or several symbols per cell in the digital pattern, since it uses two levels of reflectance (simply white and black) it encodes one binary (logic '1' or '0') symbol per cell.

The digital pattern could consist of several groups of cells. In an embodiment of the invention a single group located inside the polygon border was chosen to maximize the distance between salient points on the polygon border for most accurate homography calculation, furthermore square array were chosen for the first level of data. A minimal system requires at least the first level of data to be used, but dual levels of data can be used.

A set of fiducial marker patterns containing a polygonal border and a digital pattern are created which form the library of possible markers (considering only the first level of data), each marker has an ID associated with it corresponding to the ID in the first level of data encoded. Some examples are shown in FIG. 4 with the square border and a digital pattern consisting of a 6×6 array of cells located inside the marker. The fiducial markers are printed or otherwise mounted in the environment or on objects for detection by computer vision systems operating on image detection means such as camera images.

FIG. 2 illustrates a flow chart of marker detection method. An image is detected, this image is searched for markers as follows; first the image is searched using an edge detector to detect line segments (or edges) in the image, these edges are grouped into a polygon having more than four salient points, the distinct points (such as the polygon corners) are used from these polygons with a homography (to account for perspective distortion) to analyze the marker's digital pattern. In one embodiment of the invention, the marker is square such that quadrilaterals are the polygon shape searched for, and the digital pattern is contained inside this quadrilateral border. The polygon border is located using the detection of unique features using edge based method as shown in FIG. 3; edge pixels are located according to an edge operator, these edge pixels are grouped into line segments, these line segments are combined into polygons, with special heuristic rules to help find incomplete polygons.

In order to detect blurry images the image can be searched at different levels of resolution. In an embodiment of the invention it was chosen to perform the above stated steps at three resolution levels, full, half, and quarter as illustrated in FIG. 8. FIG. 8 illustrates from left to right the full, half and quarter resolutions. Each of the half and quarter level resolution images are found by using a low pass filter and re-sampling the prior level, this is known as an image pyramid in image processing. It was further chosen to simplify the processing in our implementation by using a simple averaging of four or sixteen neighboring pixels to provide the intensity level at the half and quarter resolution levels.

Each polygon is considered a hypothesis for a possible marker, each polygon undergoes a verification and identification stage to determine if it really is a marker. Several spots within the image are sampled for digital binary data at spots defined by the homography defined by the polygon border, this results in a set of digital binary data being extracted from the image. Due to the unknown orientation, all possible rotations of the extracted data is subject to the digital processing steps of error correction and checksum checking. If the checksum operation (a digital division operation where the remainder of the division is the output) gives the expected result, a marker is detected and the polygon is reported as its border.

The checksum and error correcting codes are chosen to have the greatest uniqueness between them by selecting the checksum and error correcting codes to achieve maximum differences between all markers in the set of possible markers, considering all relative rotations between all markers, by means of maximizing the minimum distance between the two closest markers, where distance is defined as the sum of all symbols that are different in the same spatial position in the pattern (known as Hamming distance in telecommunications).

The marker pattern can include a digital pattern added in or around the polygon border. A region is defined as a "cell", a cell only has one constant color or shade throughout. A digital symbol is a piece of information which is one of a discrete set of levels, usually a digital symbol is a logical '1' or '0' bit. Each cell has its digital symbols decoded by the detecting system, there can be one or many digital symbols encoded in each cell of the digital pattern. The decoding of digital data is done by using the homography defined by the polygon border to find where a cell within the digital pattern is located within the camera image. A single pixel or region of pixels are then analyzed to determine what digital symbols are present at that cell location.

In one embodiment of the invention the digital pattern is inside the border because the greatest accuracy of the homography that adjusts for perspective distortion is obtained with points as far apart as possible. Putting cells inside the polygon border is analogous to interpolation whereas decoding cells outside the polygon border is analogous to extrapolation, and interpolating between data points is typically more accurate that extrapolating beyond them.

In an embodiment of the invention where a square border was chosen for our polygon border, the cells were made for communicating the first level of information of equal size and evenly spaced in a square grid. Second, and third, etc levels of information can be encoded with increasingly smaller cells. If there is only one level of cells (FIG. 4 illustrates 12 markers) then these cells are square.

Furthermore, a rotationally invariant arrangement of cells can be used such that the orientation of the marker would not be needed to be known to be able to decode digital symbols from the digital pattern. This reduces the sensitivity of the system to possible failure if it attempted to determine the marker's orientation in the image prior to decoding cells into digital symbols. A square array of cells was chosen such that the marker consisting of both the polygon border and the location of cells is invariant to the four possible rotation positions. The content of the digital symbol array was chosen such that there is only one valid possibility rotation for each marker, thus the determination of the marker rotation is only done after all the digital symbols are extracted from the image.

The digital data consists of symbols which are encoded in the digital pattern. It is possible to use multiple levels of greyscale intensity or multi-spectral (color) to encode multiple symbols per cell potentially yielding a greater possible density of information to be recovered from the camera image. However, color processing introduces problems because of the unknown spectral content of the lighting, and knowledge of the spectral response to electromagnetic radiation of the actual camera used.

To make the implementation function on many camera systems without needing knowledge of their irradiance to pixel brightness transfer function, the encoding of digital symbols is limited in the digital pattern to only one symbol per cell, with each cell only being shaded with a light (example: white) or dark (example: dark) level. Each cell of the digital pattern is either light or dark depending on if the corresponding digital symbol is a binary '1' or '0'. Even though different cameras have different transfer functions between image irradiance (incoming electromagnetic radiation=light) and the number read at the pixel location, this transfer function can usually be counted upon to be monotonic, so that it is always possible to determine if one image pixel is brighter or darker than another, even if the amount by which it is brighter or darker is not known.

Therefore, digital patterns can be bi-tonal, using only white or black cells with one binary digital symbol per cell. Thus not using multi-spectral (color) information, do not require information of the light source spectral content, and do not need to know the irradiance to pixel transfer function. This makes the embodiment usable in general applications, allows the embodiment to work with the inexpensive image sensors already developed for low cost video cameras, or cell phone cameras, thus reducing the cost of positioning systems using such markers.

The data encoded in the digital pattern can be provisioned for use into some symbols for identification (referred to sub-ID), and possibly some symbols for a checksum to protect against false detections, and possibly some symbols for error correction such that incorrectly extracted symbols could be corrected. A valid system could use; just the sub-ID, the sub-ID and a checksum, the sub-ID and error correction, just a checksum for the case of a library size of 1, or all three together. To achieve good resistance to false detections and the ability to allow the marker detection to be less sensitive to errors in decoding due to causes like image noise and partial occlusion, we chose to have all three elements in our implementation, i.e. some symbols would be provisioned for the sub-ID, some symbols would be provisioned for a checksum, and some for error correction. The error correcting codes are referred to as the Forward Error Correction (FEC) codes or polynomials. Checksums, error correction, and forward error correction are well known terms in telecommunications.

Five basic designs can be chosen, with a digital binary data of 36, 49, 64, 81, 100, 121, 144, and 169 symbols corresponding to a square array of cells of width 6,7,8,9,10, 11, 12, and 13 cells respectively.

A second level data, having smaller cells can be added. This level contains cells in non regular grid patterns since they will lie in areas that do not interfere with the detection and identification of the first level cells.

In an embodiment a library of at least 1000 distinct markers with a large checksum and the ability to perform error correction was selected. Having 1000 distinct markers means the sub-ID must have at least 10 binary symbols (bits). 16 bits of checksum were chosen to reduce the odds of a false positive detection to 65536. 10 bits for error correction were chosen in this embodiment. This adds up to 36 bits giving a digital pattern of 6 rows of cells with 6 columns of cells each. A digital pattern of 36 bits were chosen because the smaller size of 25 cells (5 rows by 5 columns) would not give enough data, and because a digital pattern of larger would give us more data than necessary for the applications envisaged in our first implementation. With a 5×5 array only 15 symbols would be (bits) left after allocating 10 symbols to get a library size of a 1000.

In another embodiment, a second, more dense, set of data is present in the marker which is seen at second distance closer to the marker. 124 bits are used of which 32 are used to encode information. Together the first and the second level of data provide 4 trillion unique possibilities.

The creation of the digital patterns (shown in FIG. 10) consists of combining the possible elements of sub-ID, checksum, and error correcting codes by means of digital convolution. This is the same operation as binary multiplication if all the sub-ID, checksum, and error correcting codes are expressed in binary form. In this way, the information is spread evenly throughout the digital pattern. The result of the binary multiplication is a one dimensional binary sequence which is placed in the digital pattern in N rows of M symbols. In this embodiment, M=N=4. This operation is performed when creating the marker patterns.

Likewise, the reverse operation of digital division is performed when validating the digital pattern extracted relative to a polygon border. The two-dimensional array of decoded symbols is turned into R one-dimensional binary sequences, where R is the number of sides of the polygon (R=4 in our implementation). Each of the R one-dimensional sequences is treated as a binary number and the error correcting codes (FEC in figure) are binary divisors. The one-dimensional binary number can be divided by the FEC codes in any order; each division operation provides a remainder, together all these remainders are analyzed with conventional telecommunications methods to determine if any symbols in the original one-dimensional sequence might contain errors. If all the remainders are consistent with no errors, the dividend is passed onto the step outlined in the next paragraph. If the reminders are otherwise, the one-dimensional sequence is modified such that the division operations provide remainders are consistent with no errors, this dividend is then sent to the next stage.

The dividend from the above error detection and correction stage is then divided by another number: the checksum. When the division operation is complete, the remainder is examined, if it is not the expected result the one-dimensional sequence of binary symbols is discarded. If all R one-dimensional sequences fail this division test then the entire polygon border is deemed to not represent a fiducial marker. With polygons of four sides, a typical image can be expected to contain many quadrilateral shapes such as windows, boxes, etc which are not markers so this operation of analyzing the digital pattern will be performed many times for a camera image, for all these non-marker polygons the checksum test has low probability of passing.

FIG. 6 illustrates the stages of verification and identification using the digital pattern- performed after polygon outlines have been detected. The example is shown for one polygon that is detected as a marker. In the upper left corner of FIG. 6 the original camera image can be seen. In the upper right corner an overlaid grid demonstrates how homography can be used to align parts of the digital binary code. The lower left corner, the points are sampled to provide digital symbols (in this example a 6×6 array of cells) which are interpreted as N linear digital codes. IN the lower right one of the N codes passes the checksum test and the marker is identified as marker #300 from the library.

FIG. 11 illustrates the decoding of digital pattern. A detected tag contains in this example 36 bits of code. The system reads the tag in all for rotations, these four readings are subjected to error correction and detection such that only one should identified as the proper reading. The successful reading is subjected to deconvolution and XOR mask where the tag information is then extracted.

The invention claimed is:

1. A marker detectable by visual means comprising:
    a. a polygonal border comprising of at least four non collinear salient points;
    b. a binary digital code on said marker;
    c. the binary digital code comprising information data, checksum and error correction;
    d. a first level of binary digital code readable at a first given distance;
    e. a second level of binary digital code readable at a second given distance;
    f. where said second given distance is less than said first given distance; and
    g. where said second level binary digital code is smaller in size than the first level binary digital code and does not interfere with the reading of said first level binary digital code.

2. The marker of claim 1 where the binary digital code is located inside the polygonal border.

3. The marker of claim 2 where the information data comprises unique identification information to link to a web site.

4. The marker of claim 2 where the border is a quadrilateral.

5. The marker of claim 1 where the first level of binary digital code is a NXM array of cells and the second level of binary digital code is located along the borders of the cells between the cells.

6. The marker of claim 5 where the first level of binary digital code is an NXN array of cells containing white or black patterns and the second level of binary digital code is an MXM array of cells also containing black or white patterns.

7. The marker of claim 6 where N is one of 4, 5, 6, 7, 8, 9, 10, 11, 12, or 13, and where M is 4, 5, 6, 7, 8, 9, 10, 11, 12, or 13.

8. The marker of claim 1 where the binary digital code is selected so as to have a minimal hamming distance from all other markers in all four possible rotation positions, mirrored position and from itself rotated in all four positions.

9. The marker of claim 1 where the first level of binary digital code is an 6=6 array of cells and second level of binary digital code is a smaller set of cells in the corners or between the first level cells and on the line bordering two first level cells.

10. The marker of claim 9 where the first level of binary digital code carries 26 bits of information data and 10 bits for checksum and error correction, and the second level of binary digital code comprises four quadrants, each quadrant comprising 31 cells, where the 31 cells carry 16 bits of information data, 5 bits of checksum and 10 bits of error correction.

11. The marker of claim 10 where two of the four quadrants contain redundant information.

12. A method for detecting a marker comprising the steps:
   a. detecting an image to be evaluated using an image sensor;
   b. using an edge detector to detect an edge in said image;
   c. grouping more than one edge into a polygon having salient points;
   d. calculating homography from polygon salient points;
   e. generating a list of homographies;
   f. extracting binary data from input image having homographies;
   q. verifying if the image is a marker by performing check sum and error correction functions;
   h. if the image is a marker, identify as a marker and verify binary data.

13. The method of claim 12 where there is an additional step of processing the marker in all possible rotation positions.

14. The method of claim 12 where there is an additional step of identifying and verifying a $2^{nd}$ level of binary digital code.

15. A method for identifying a marker comprising:
   a. detecting a potential marker to be evaluated using an image sensor;
   b. detecting edgels using an edge detector;
   c. grouping edgels into line segments;
   d. making a list of line segments;
   e. grouping line segments into polygons;
   f. making a list of polygons.

16. The method of claim 15 where the detection of the potential marker is made at different resolutions.

17. The method of claim 16 where the different resolutions are full resolution, half resolution and quarter resolution.

18. The method of claim 15 where the polygons of step e) are evaluated based on the following five heuristic rules;
   a. when the border can be found by joining the line segments,
   b. when the border is found when one or more corners are missing but the border lies entirely within the image,
   c. when a line segment is broken when the border lies entirely within the image,
   d. when one or more corners are missing in the detected image
   e. when one or more line segments are missing in the detected image.

* * * * *